(12) United States Patent
Harada et al.

(10) Patent No.: US 6,368,776 B1
(45) Date of Patent: Apr. 9, 2002

(54) TREATMENT APPARATUS AND TREATMENT METHOD

(75) Inventors: Koji Harada, Kikuchi-gun; Junichi Nagata, Kumamoto; Yasunori Kawakami, Kikuchi; Masatoshi Kaneda, Kikuchi-gun; Norio Semba, Kikuchi-gun; Yoshio Kimura, Kikuchi-gun; Masami Akimoto, Kumamoto; Yasuhiro Sakamoto, Kamoto-gun; Nobuyuki Jinnai, Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/270,806

(22) Filed: Mar. 17, 1999

(30) Foreign Application Priority Data

| Mar. 18, 1998 | (JP) | ............................................ 10-90759 |
| Nov. 12, 1998 | (JP) | ........................................... 10-338498 |
| Nov. 12, 1998 | (JP) | ........................................... 10-338499 |

(51) Int. Cl.[7] .............................. G03C 5/00; F27B 9/06
(52) U.S. Cl. ....................................... 430/327; 219/388
(58) Field of Search .............................. 430/327; 438/5; 219/388

(56) References Cited

U.S. PATENT DOCUMENTS 5,452,052 A * 9/1995 Takado et al. ................. 355/53
6,002,108 A * 12/1999 Yoshioka ..................... 219/388

FOREIGN PATENT DOCUMENTS

| JP | 2-1113 |   | 1/1990 |
| JP | 2-73635 | * | 3/1990 |
| JP | 6-16410 | * | 3/1990 |

* cited by examiner

Primary Examiner—Shean C. Wu
(74) Attorney, Agent, or Firm—Rader, Fishman & Grauer, PLLC

(57) ABSTRACT

A gas supplied from a gas source is exposed to an atmosphere above a liquid surface in a tank saving the liquid and thereafter is supplied around a wafer in a treatment chamber through a gas supply passage and a supply port. The gas supplied around the wafer uniformly flows from around the wafer toward above the center of the wafer and thereafter is discharged from an exhaust port which is formed at the top of the treatment chamber. Meanwhile, with respect to the wafer, heat treatment is performed by a heating mechanism and a predetermined PEB is carried out. The humidified gas is supplied into the treatment chamber, thereby preventing drying in the treatment chamber. Therefore, water in resist is not taken out, resulting in that a required resist pattern can be formed on the wafer.

23 Claims, 14 Drawing Sheets

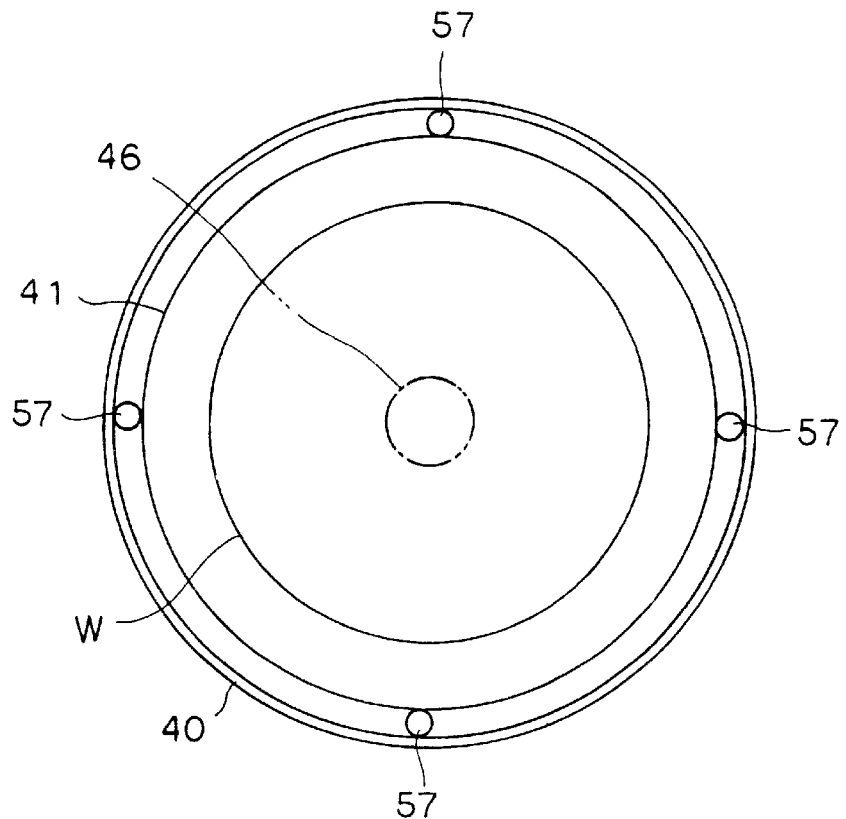
F I G. 5
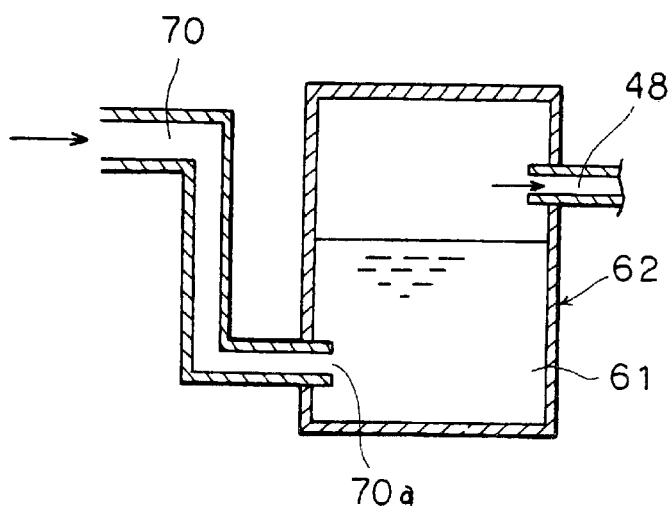
F I G. 6

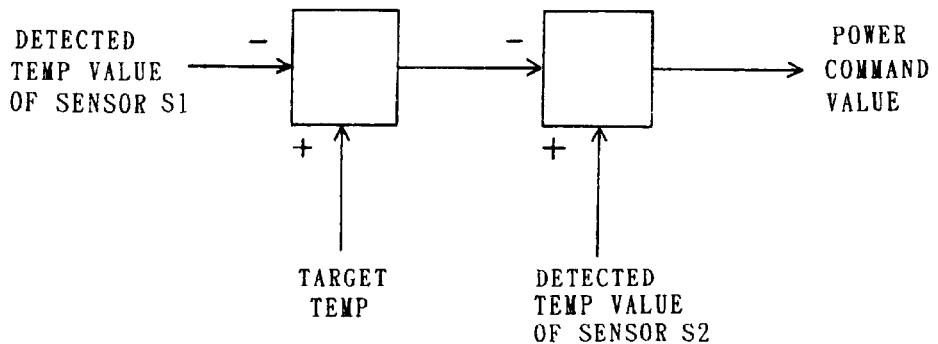
F I G. 1 1
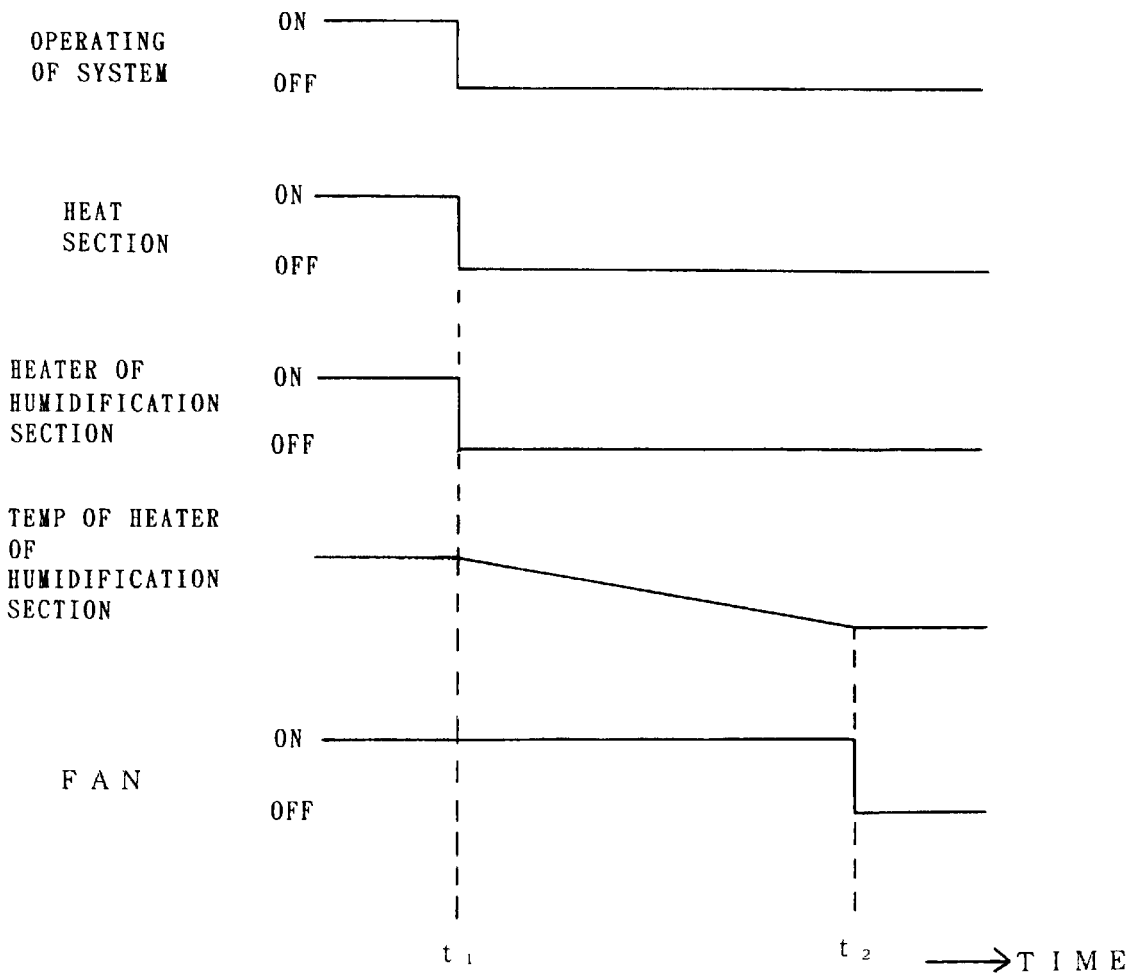
F I G. 1 2

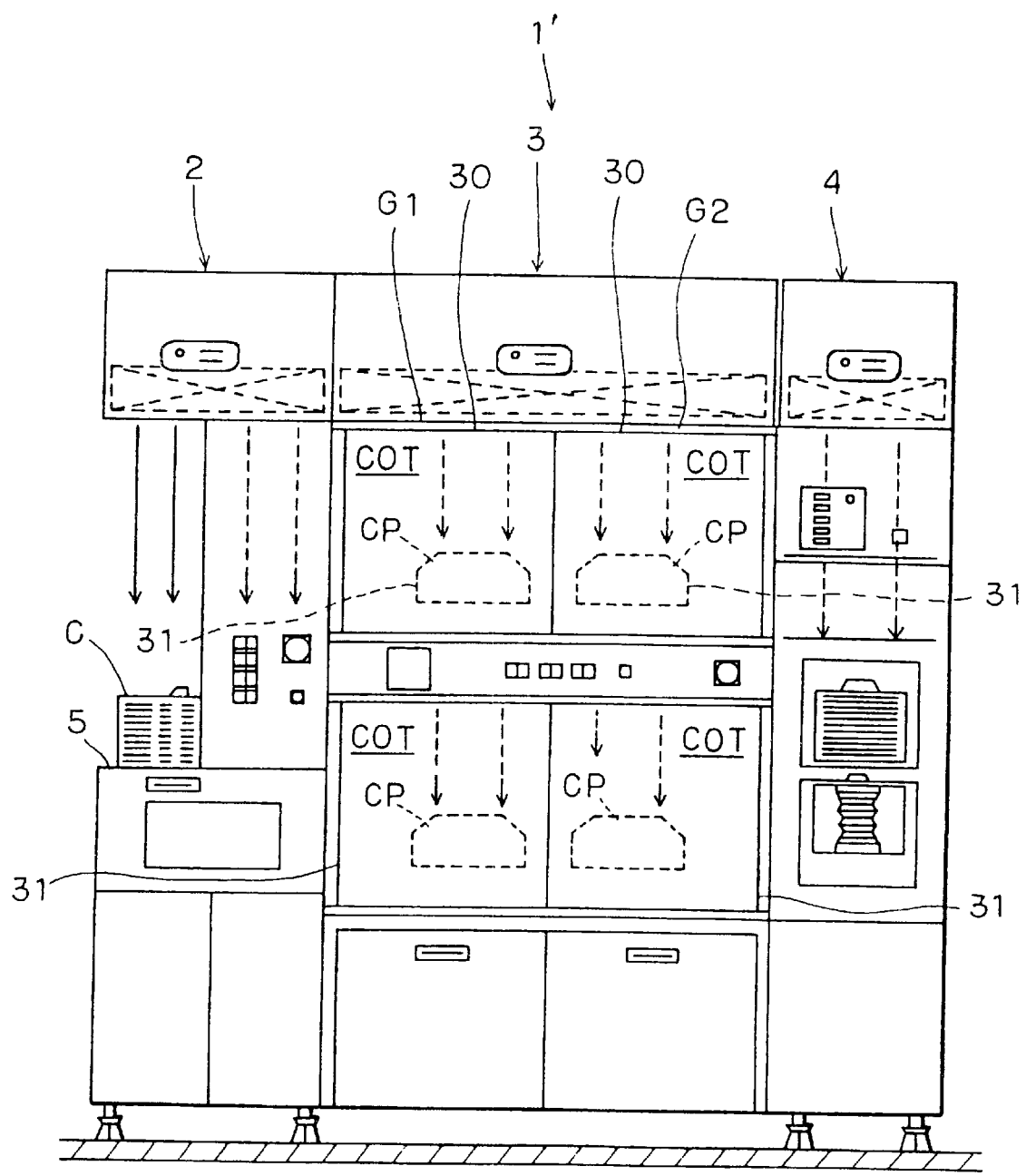
F I G. 1 3

TREATMENT APPARATUS AND TREATMENT METHOD

BACKGROUND OF THE INVENTION

1. Field of the Invention

The present invention relates to a treatment apparatus and a treatment method, for example, a baking unit for heating a substrate such as a semiconductor wafer, a resist coating unit for coating the substrate with resist, a developing unit for developing the substrate, or the like.

2. Description of the Related Art

In processes of semiconductor device fabrication, the photolithography process is conventionally performed to form a resist pattern on a surface of a substrate such as a semiconductor wafer (referred to as "a wafer" hereinafter).

In the photolithography process, there are a resist coating process for coating a wafer with a resist, an exposing treatment process for exposing the resist-coated wafer, and a developing treatment process for developing the wafer. Before and/or after each treatment process, a heat treatment (bake) is suitably performed to the wafer as needed. More specifically, so-called a dehydrating-bake for drying the wafer, so-called a pre-bake for removing the resist solvent in the resist by heating, so-called a post-exposure-bake (referred to as "PEB" hereinafter) which is performed between the exposing treatment process and the developing treatment process, a post-bake which is performed after completing the developing treatment process, and the like.

Explaining these in order of treatment, first of all, the dehydrating-baked wafer is coated with a resist. Next, after the above wafer is pre-baked, the wafer is exposed by an exposing unit. Sequentially, after the exposed wafer is heat-treated by PEB, the wafer is treated with the predetermined development, thereafter the post-bake is performed.

In the aforesaid processes, where chemically-amplifying-type resist is used as a resist, acid is generated in the resist during the exposing treatment. The wafer is heat-treated by PEB, thereby catalytic reaction in the acid is activated, so that solubility or insolubility of chemically-amplifying-type resist to the developing solution is accelerated. In the heat treatment by PEB, however, only a mounting table is heated in a treatment chamber in the conventional art, therefore relative humidity lowers and an atmosphere is extremely dry in the treatment chamber. When the inside of the treatment chamber becomes dry, water is removed from the resist on the wafer, so that there arises a possibility that the required resist pattern can not be formed.

In the aforesaid resist coating process, the developing treatment process, or the like, since temperature or humidity of the atmosphere during the treatment affects on the film-thickness and uniformity in the resist and developing solution, the temperature and humidity need to be adjusted to predetermined values. Therefore, an atmospheric gas which is air-conditioned through, for example, a humidifying section where water is heated by a heater to evaporate and additionally a heating section to control temperature is sent through ducts into the treatment chambers in which resist-coating and developing treatment are performed. However, where the apparatus is stopped driving, immediately after the heater of the humidifying section is off, the water therein is still warm. Thus, a large amount of water vapor still evaporating from the humidifying section condenses into dew and remains on the inner wall of the duct. As a result, when the apparatus is resumed driving, the water in the duct evaporates, therefore it occasionally takes long time till humidity of the air sent into the treatment chamber becomes stable. Further, a temperature controller which forms the heating section and the humidifying section is generally provided outside the treatment chamber, thus the temperature on the outlet side of the temperature control section happens to be unstable depending on the outside atmosphere. Therefore, where the temperature control is performed, for example, based on the value of a temperature sensor attached on the outlet side of the temperature control section, the temperature of the atmospheric gas sent into the treatment chamber often becomes unstable.

In the coating and developing system for performing a series of processes as described above, for example, an atmospheric gas which is controlled in temperature and humidity is sent from one supply source to a plurality of treatment chambers for developing treatment. The coating and developing system, however, has a heat treatment unit in addition to the treatment chambers for performing developing treatment and resist-coating. Therefore, in the above treatment chamber disposed near the heat treatment unit or in the treatment chamber into which the atmospheric gas flows through a passage near the heat treatment unit, the atmospheric gas rises in temperature, thereby the atmosphere of each chamber varies in temperature among the treatment chambers. As a result, there is a problem that the thickness of coated-film differs among the treatment chambers and the treatment can not be uniformly carried out. It is conceivable to control the atmospheric gas in temperature and humidity individually for each treatment chamber, but this method requires high cost and a large space. Furthermore, for uniform treatment, it is also conceivable to control individually the rotational frequency of wafers at the time of coating in correspondence with the temperature and humidity of the atmospheric gas. This requires adjustment of treatment conditions or the like in each treatment chamber, making a disadvantage due to the complicated procedures. Another disadvantage is that the treatment becomes unstable because heat can not be uniformly received from the heat source.

SUMMARY OF THE INVENTION

An object of the present invention is to provide a treatment apparatus and a treatment method capable of forming a required resist pattern, without water in resist being taken out.

Another object of the present invention is to provide a treatment apparatus and a treatment method in which humidity of an atmospheric gas can be quickly stable at the time of resumption of driving the treatment apparatus.

Still another object of the present invention is to provide a treatment apparatus and a treatment method in which temperature control of the atmospheric gas can be stably performed.

Yet another object of the present invention is to provide a treatment apparatus and a treatment method capable of controlling temperature and humidity of the atmosphere respectively for a plurality of treatment chambers, thereby controlling atmospheres of all treatment chambers into the same and controlling atmospheres differently for each treatment chamber according to treatment matters in the respective treatment chambers.

To solve the above disadvantages, the first aspect of the present invention, in an apparatus to treat a substrate, includes a treatment chamber for treating the substrate and a humidifying mechanism for supplying humidified gas into the treatment chamber.

The second aspect of the present invention, in an apparatus to treat a substrate, includes a treatment chamber for treating the substrate, a gas supply passage for supplying an atmospheric gas into the treatment chamber, a heating section provided on the gas supply passage for heating the gas, a humidifying section provided on the gas supply passage for humidifying the gas, at least one blowing section for blowing gas in the gas supply passage, and a control section which stops the humidification of the gas performed by the humidifying section after completion of the substrate treatment in the treatment chamber, blows gas in the treatment chamber by the blowing section, and then stops blowing conducted by the blowing section.

The third aspect of the present invention, in an apparatus to treat a substrate, includes a treatment chamber for treating the substrate, a gas supply passage having a connecting section connected to the treatment chamber for supplying an atmospheric gas through the connecting section into the treatment chamber, a heating section having an outlet connected to the gas supply passage and heating the gas to supply from the outlet into the gas supply passage, a first temperature detecting section disposed at or in the vicinity of the heating section, a second temperature detecting section disposed at or in the vicinity of the connecting section of the gas supply passage, and a control section to control heating of the gas conducted by the heating section based on the detected results of the first and second temperature detecting sections.

The fourth aspect of the present invention, in an apparatus to treat a substrate, includes a plurality of treatment chambers for treating the substrate, a gas source for sending the temperature-controlled atmospheric gas to each treatment chamber, and a plurality of atmosphere control sections provided in each treatment chamber and temperature-controlling the atmospheric gas sent from the gas source to supply into each treatment chamber.

The fifth aspect of the present invention, in a method to treat a substrate, includes (a) a process of treating the substrate in a treatment chamber and (b) a process of supplying the humidified gas into the treatment chamber during the process (a).

The sixth aspect of the present invention, in a method to treat a substrate, includes (a) a process of treating the substrate in a treatment chamber, (b) a process of sending a heated and humidified atmospheric gas through a gas supply passage into the treatment chamber during the process (a), (c) a process of sending an atmospheric gas which is stopped being humidified through the gas supply passage into the treatment chamber after the process (a), and (d) a process of stopping sending the atmospheric gas through the gas supply passage into the treatment chamber after the process (c).

The seventh aspect of the present invention, in a method to treat a substrate, includes a process of sending a temperature-controlled atmospheric gas from a gas source to a plurality of treatment chambers for treating the substrates and a process of temperature-controlling the atmospheric gas sent from the gas source for each treatment chamber and supplying the gas to each treatment chamber.

In the present invention, when the substrate is heated in the treatment chamber after, for instance, the resist-coated substrate is exposed, the humidified gas is supplied into the treatment chamber, thereby preventing relative humidity from lowering and the inside of the treatment chamber from drying. Accordingly, the substrate can be heated in the treatment chamber having the humidified atmosphere, so that water in the resist is not taken out. Consequently, the required resist pattern can be formed.

Further, in the present invention, when supplying of the atmospheric gas into the treatment chamber is stopped, the blowing section is kept in operation while a water temperature in the humidifying section is still high and stopped after the water temperature goes down to a certain degree. Therefore, when the treatment apparatus resumes operation, the inside of the gas supply passage is in a dry condition, which allows the humidity of the atmospheric gas to be stable, so that the operation can be immediately resumed.

Furthermore, according to the present invention, when the gas is controlled over temperature by the heating section of the temperature control section, the temperature control is performed based on both values of the temperature in the vicinity of the outlet of the temperature control section and the temperature in the treatment chamber, therefore the temperature of the atmospheric gas supplied into the treatment chamber becomes stable.

Yet, according to the present invention, the temperature of the atmospheric gas is roughly controlled in the gas source and is finely controlled in each atmosphere control section of a plurality of the treatment chambers, therefore the gas can be set into a required atmosphere in each treatment chamber. Accordingly, even if, for example, a received heat-influence from the heat treatment unit differs in degree among the treatment chambers in accordance with difference of position to the heat treatment unit, when the treatment chambers perform the same treatment, the atmospheric temperatures can be kept equal. As a result, the treatment is uniformly performed with respect to the treatment differed by the atmospheric temperature.

These objects and other objects and advantages of the present invention can be easily confirmed with the following description and the accompanying drawings.

BRIEF DESCRIPTION OF THE DRAWINGS

FIG. 5 is a plane view of the prebaking unit shown in FIG. 4;

FIG. 6 is an explanatory view of a prebaking unit according to another embodiment;

FIG. 11 is an explanatory view of a temperature control method in the resist coating unit shown in FIG. 9;

FIG. 12 is a timing chart showing motion of each section in the resist coating unit shown in FIG. 9;

FIG. 13 is a front view of a developing and coating treatment system according to another embodiment of the present invention;

DETAILED DESCRIPTION OF THE PREFERRED EMBODIMENT

Figure 1:
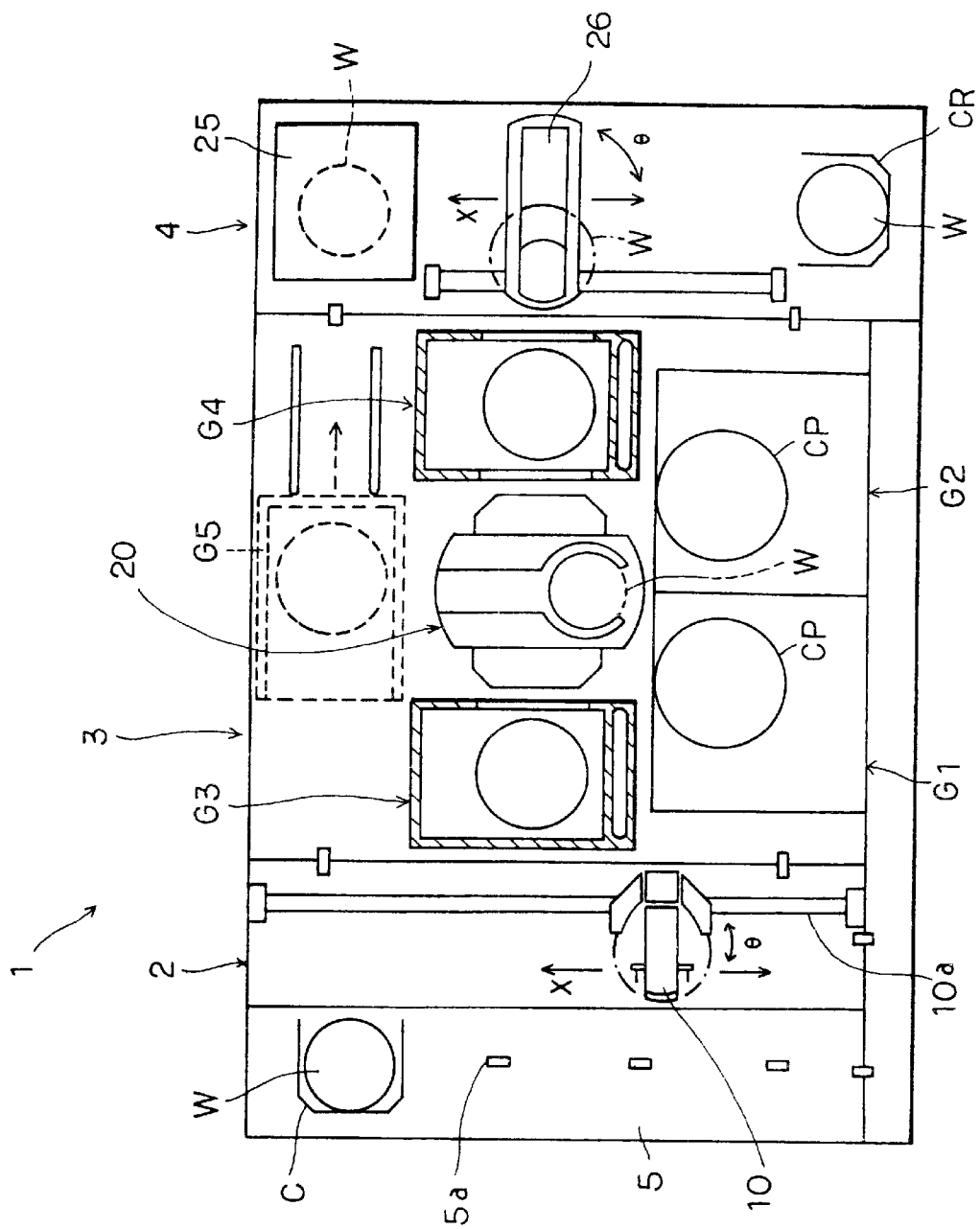
FIG. 1 is a plane view of a developing and coating treatment system according to an embodiment of the present invention.

As shown in FIG. 1, a coating and developing system 1 has a configuration in which a cassette station 2 for carrying twenty-five wafers W, for example, per cassette C into/out from the coating and developing system 1 from/to the outside and carrying the wafers into/out from the cassette C, a process station 3 in which various kinds of treatment units are multi-tiered at designated positions and each treatment unit gives a predetermined treatment to the wafers W one by one in a coating and developing process, and an interface section 4 for sending and receiving to/from an aligner (not shown) which is disposed adjacent to the process station 3 are integrally connected.

In the cassette station 2, a plurality of, for example four cassettes C are mounted in a line in an X-direction (a vertical direction in FIG. 1), with respective ways in/out for the wafers W opening to the process station 3 side at positions of positioning projections 5a on a cassettes mounting table 5 which serves as a mounting section. A wafer carrier 10, which can move in the direction of disposition of the cassettes C (the X-direction) and in the direction of disposition of the wafers W stored in the cassettes C (a Z-direction; a vertical direction), is movable along a carrier path 10a to be selectively accessible to each cassette C.

The wafer carrier 10 is also rotatable in a θ-direction and accessible to an alignment unit (ALIM) and an extension unit (EXT) included in multi-tiered units of a third treatment unit group G3 on the process station 3 side as described later.

In the process station 3, a main carrier apparatus 20 is placed in a center portion thereof. Around the main carrier apparatus 20, one or various kinds of treatment units are multi-tiered to compose a treatment unit group. In the coating and developing system 1, five treatment unit groups G1, G2, G3, G4, and G5 can be arranged. The first and the second treatment unit group G1 and G2 are arranged on the front side of the coating and developing system 1, the third treatment unit group G3 is disposed adjacent to the cassette station 2, the fourth treatment unit group G4 is disposed adjacent to the interface section 4, and the fifth treatment unit G5 shown with a dashed line is disposed on the rear side.

Figure 2:
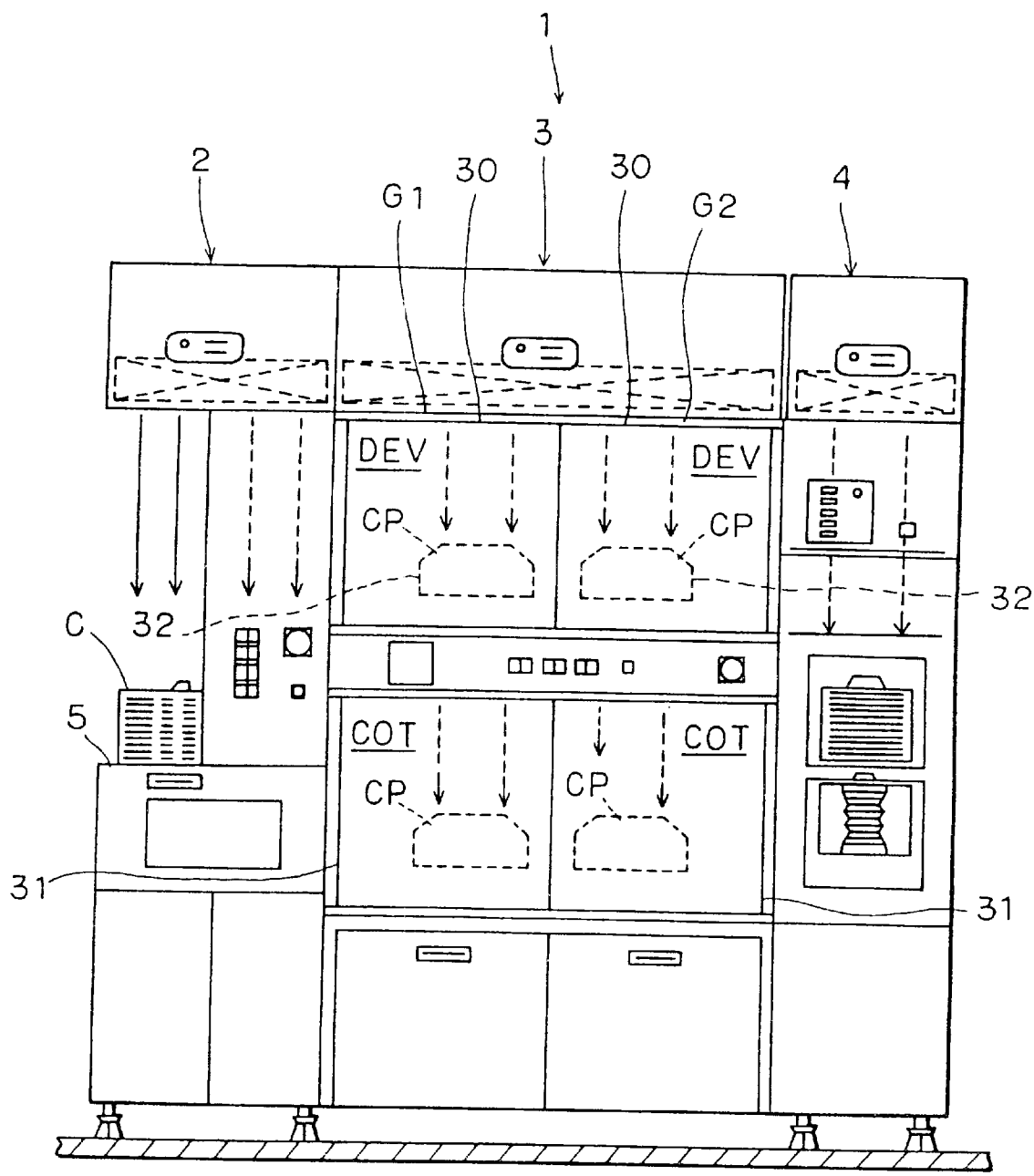
FIG. 2 is a front view of the developing and coating treatment system shown in FIG. 1.

As shown in FIG. 2, in the first treatment unit group G1, two spinner-type treatment units for mounting the wafer W on a spin chuck in a cup 32 (CP) and performing predetermined treatments, for example, a resist coating unit 31 (COT) and a developing unit 30 (DEV) are two-tiered from the bottom in order. Also in the second treatment unit group G2 similarly to the first treatment unit group G1, two spinner-type treatment units, for example, the resist coating unit 31 (COT) and the developing unit 30 (DEV) are two-tiered from the bottom in order.

Figure 3:
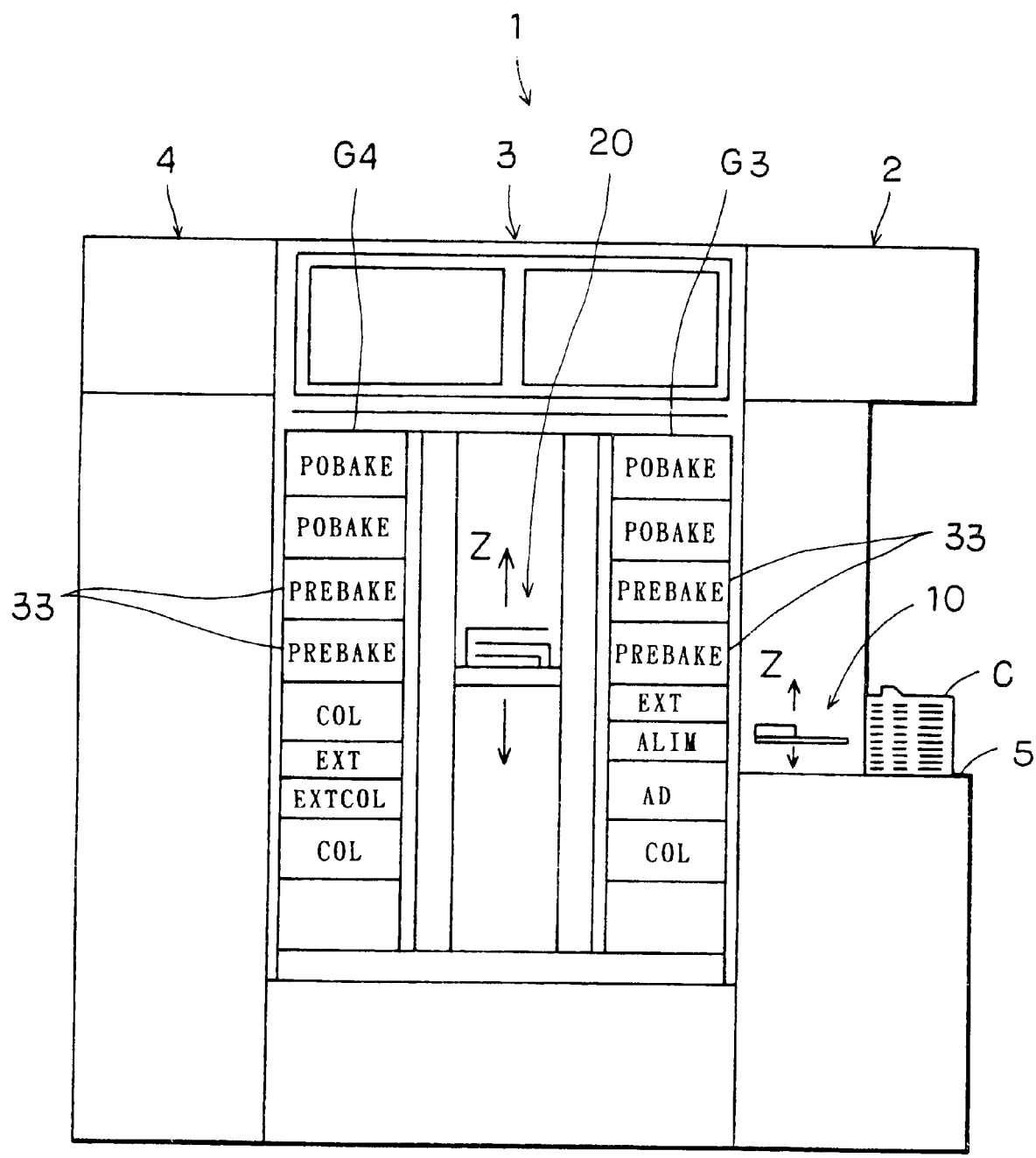
FIG. 3 is a rear view of the developing and coating treatment system shown in FIG. 1.

As shown in FIG. 3, in the third treatment unit group G3, for example, a cooling treatment unit (COL) for performing cooling treatment, an adhesion unit (AD) for improving fixing of resist and the wafer W, the alignment unit (ALIM) for positioning the wafer W, the extension unit (EXT) for keeping the wafer on standby, a prebaking unit 33 (PREBAKE) and a postbaking unit (POBAKE) for performing heat treatment, and the like are eight-tiered. As shown in FIG. 3, in the fourth treatment unit group G4, the cooling treatment unit (COL), an extension cooling unit (EXTCOL), the extension unit (EXT), the prebaking unit 33 (PREBAKE), the postbaking unit (POBAKE), and the like are eight-tiered.

In the interface section 4, as shown in FIG. 1, a peripheral alignment unit 25 and a wafer carrier 26 are disposed at a rear portion and in a central portion respectively. The wafer carrier 26 is movable in the X-direction and in the Z-direction (the vertical direction) and rotatable in the θ-direction to be accessible to both the extension unit (EXT) included in the fourth treatment unit group G4 on the process station 3 side and a wafer delivery table (not shown) on the aligner unit (not shown) side.

Figure 4:
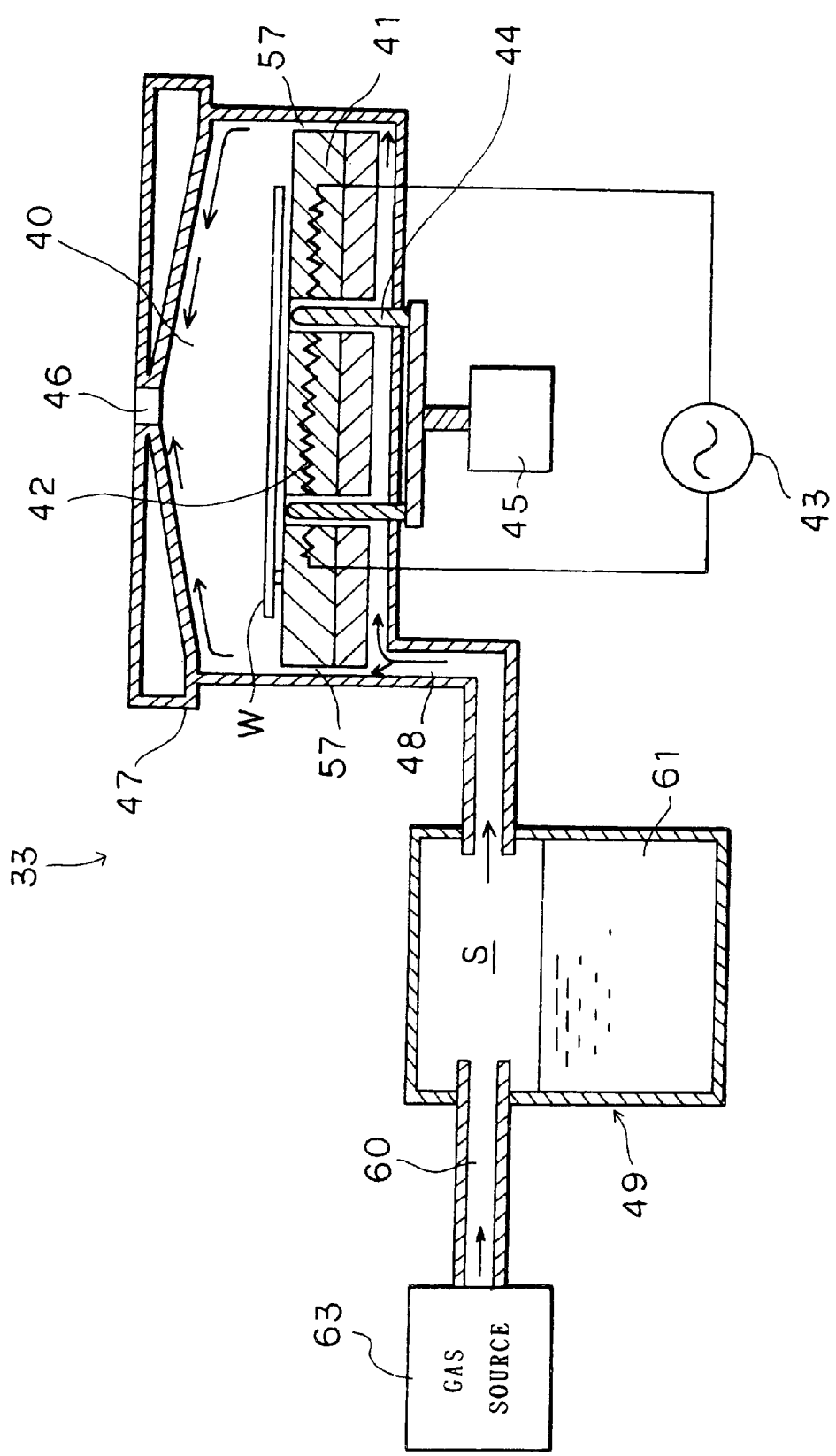
FIG. 4 is an explanatory view of a prebaking unit shown in FIG. 1.

As shown in FIG. 4, a mounting table 41 for mounting the wafer W is provided near the center in a treatment chamber 40 of the prebaking unit 33. The mounting table 41 is formed into a nearly round shape similarly to the inner wall of the treatment chamber 40. A plurality of supply ports 57 for gas communicating with a gas supply duct 48 described later are arranged around the mounting table 41 as shown in FIG. 5. The supply port 57 may be formed into, for example, a shape of arc-shaped slit. Moreover, a heating mechanism 42, such as a heater, is provided for heating the wafer W inside the mounting table 41. The heating mechanism 42 has a configuration of capable of heating the wafer W when electric power is supplied thereto from an alternating current power supply 43 which is provided outside the treatment chamber 40.

The mounting table 41 is provided with a support pin 44 which can appear and disappear to/from the mounting table 41. The support pin 44 is connected to a hoisting and lowering mechanism 45 which is provided outside the treatment chamber 40. Accordingly, the support pin 44 can be vertically moved by the operation of the hoisting and lowering mechanism 45. At the top of the treatment chamber 40 is provided a cover member 47 which has an appropriate inclination so as to guide efficiently atmosphere in the treatment chamber 40 to an exhaust port 46.

Outside the treatment chamber 40, an airtight tank 49 is provided and inside the tank 49, liquid 61 such as pure water is saved. The tank 49 is provided with gas supply ducts 60 and 48 which are arranged in a manner to pierce the side walls of the tank 49 and communicate with a space S over the liquid 61 saved in the tank 49. The gas supply duct 60 is connected with a gas source 63 which supplies gas such as nitrogen gas. The other gas supply duct 48 communicates with the supply port 57 in the treatment chamber 40 as has been described.

The prebaking unit 33 according to the embodiment has a configuration as described above. Next, actions and effects of the prebaking unit 33 will be described. A gas which is supplied from the gas source 63 is first introduced through the gas supply duct 60 to the space S over the liquid 61 in the tank 49. Next, the gas is exposed to the atmosphere over the liquid 61 in the tank 49 and thereafter is supplied around the wafer W through the gas supply duct 48 and the supply port 57.

The gas supplied around the wafer W uniformly flows from around the wafer W toward above the center of the wafer W and thereafter is discharged from the exhaust port 46 which is formed at the top of the treatment chamber 40. Meanwhile, a heat treatment is performed to the wafer W by the heating mechanism 42 and a predetermined PEB is carried out.

The atmosphere over the liquid 61 in the tank 49 is moist with vapor of the liquid 61, therefore the gas which has been exposed to the atmosphere is humidified. Accordingly, the humidified gas is supplied into the treatment chamber 40, thereby preventing the treatment chamber 40 from drying. Thus, PEB can be carried out to the wafer W in the humidified treatment chamber 40. Consequently, a required resist pattern is formed on the wafer W, without water in resist being taken out.

Further, in the treatment chamber 40, since a uniform flow of gas from around the wafer W toward above the center thereof is formed as aforementioned, the atmosphere over the wafer W can be made uniform with the humidified gas. Accordingly, PEB can be uniformly performed to the wafer W.

In the aforesaid embodiment, the tank 49 is employed as a exclusive humidifying unit for humidifying inside the treatment chamber 40, in place thereof, a tank 62 as shown in FIG. 6 can be used.

As shown in FIG. 6, in the tank 62, a supply port 70a of a gas supply duct 70 opens in the liquid 61 so that the gas supplied from the gas source (not shown) can be supplied into the liquid 61 saved in the tank 62. Therefore, the liquid 61 saved in the tank 62 can be stirred in bubbling by the gas, so that a large quantity of humidified gas can be continuously supplied through the gas supply duct 48 and the supply port 57 to the surrounding of the wafer W. Accordingly, the atmosphere in the treatment chamber 40 can be easily and more quickly humidified.

Figure 7:
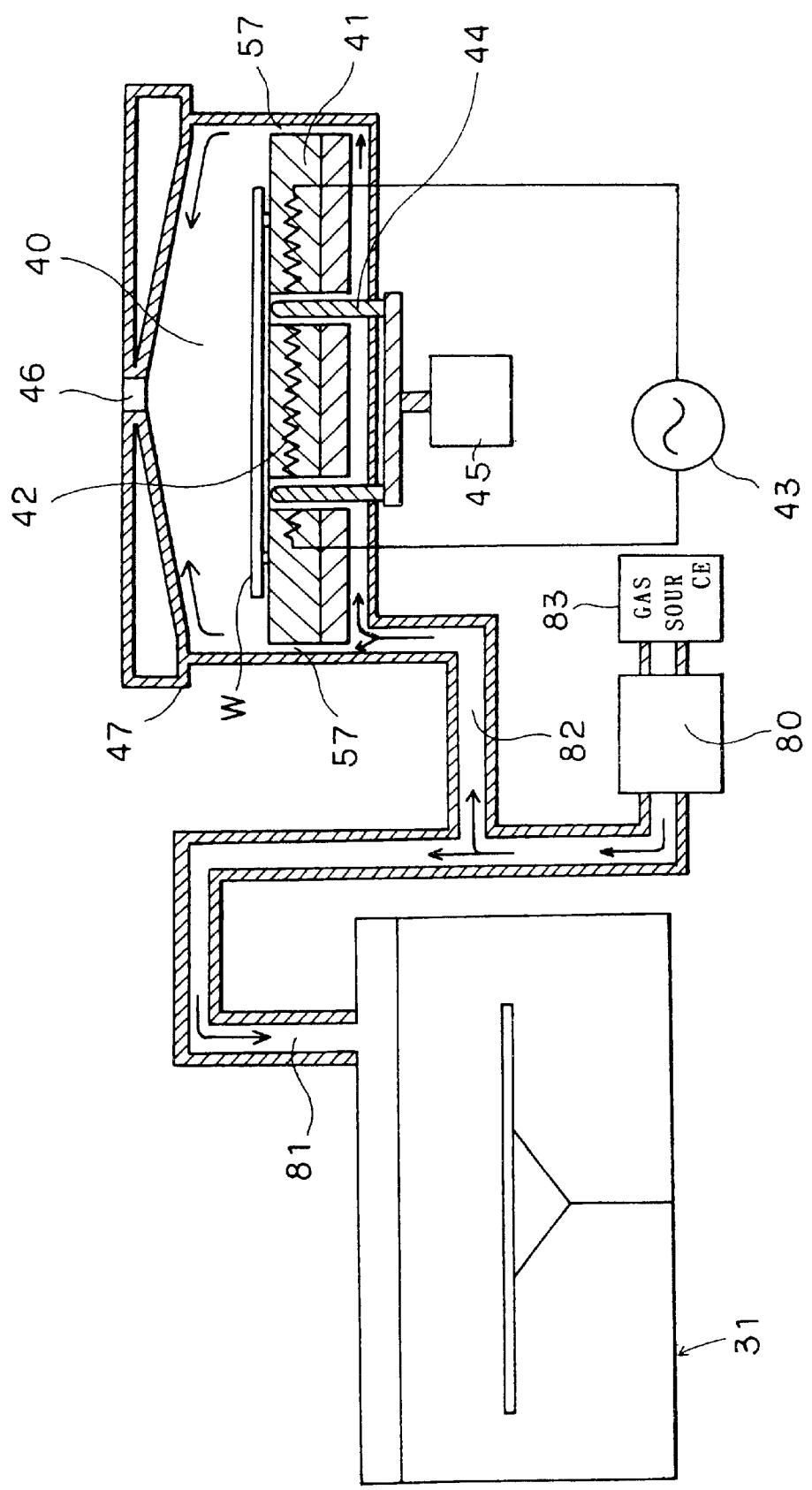
FIG. 7 is an explanatory view of a prebaking unit according to still another embodiment.

As another embodiment, a prebaking unit as shown in FIG. 7 can be proposed. In the description of the prebaking unit hereinafter, the description about components having function and configuration similar to those of hereinbefore will be omitted by giving the same reference numerals.

A clean air used in the resist coating unit 31 is gas which is supplied from a gas source 83 through a temperature/humidity control unit 80 into the resist coating unit 31. The gas is suitably controlled in temperature and humidity by the temperature/humidity control unit 80 to have no influence on the characteristics of resist which is sensitive to temperature and humidity.

Thus, as shown in FIG. 7, the clean air which is supplied through a gas supply duct 81 into the resist coating unit 31 is partially separated. The partially separated clean air is supplied through a gas supply duct 82 and the supply port 57 into the treatment chamber 40. According to the above configuration, the clean air which is controlled in preferable temperature and humidity for the resist as described above can be supplied into the treatment chamber 40, therefore PEB can be performed in the humidified treatment chamber 40. Thus, a required resist pattern can be formed, without water in resist being taken out. Furthermore, the clean air supplied into the treatment chamber 40 is partially separated from the clean air which is originally to be used in the resist coating unit 31, therefore an exclusive humidifying unit such as the aforesaid tank 49 or tank 62 is unnecessary.

Figure 8:
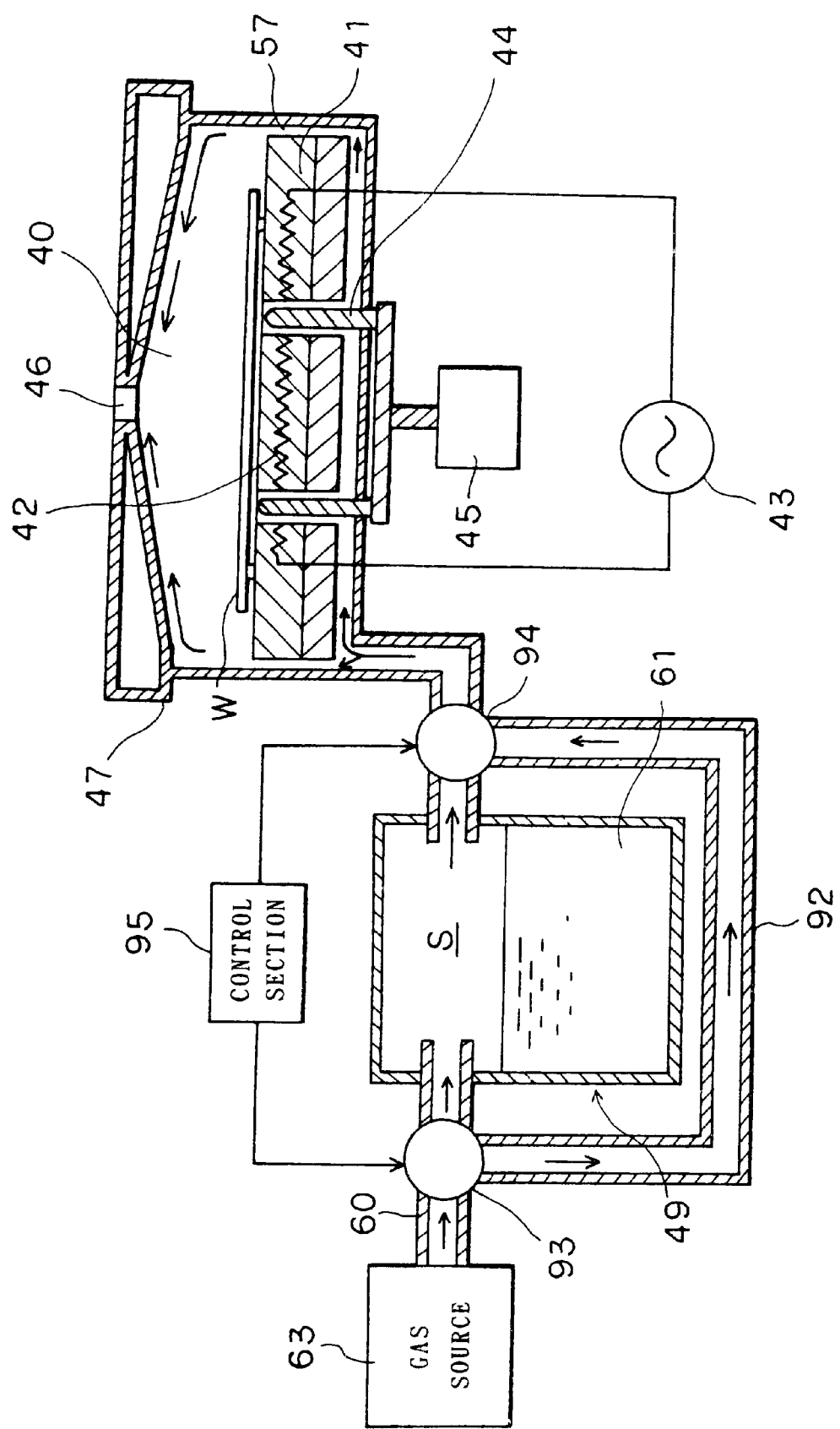
FIG. 8 is an explanatory view of a prebaking unit according to yet another embodiment.

As still another embodiment, a prebaking unit shown in FIG. 8 can be proposed. In the description of the prebaking unit hereinafter, description about components having function and configuration similar to those of hereinbefore will be omitted by giving the same reference numerals.

In the prebaking unit, switching valves 93 and 94 are respectively provided on the gas supply ducts 60 and 48 for branching off to a diverging duct 92. The switching valves 93 and 94 are operated by a control section 95. The switching may be operated by hand. Shifting between the tank 49 and the diverging duct 92 through which the gas supplied from the gas source 63 is supplied into the treatment chamber 40 is performed by switching the valves.

The gas from the gas source 63 is generally supplied through the tank 49 into the treatment chamber 40. However, resist dislikes high humidity depending on the kind thereof. In this case, the gas from the gas source 63 is advisably supplied through the diverging duct 92 into the treatment chamber 40.

Next, another embodiment of the present invention will be described hereinafter.

Figure 9:
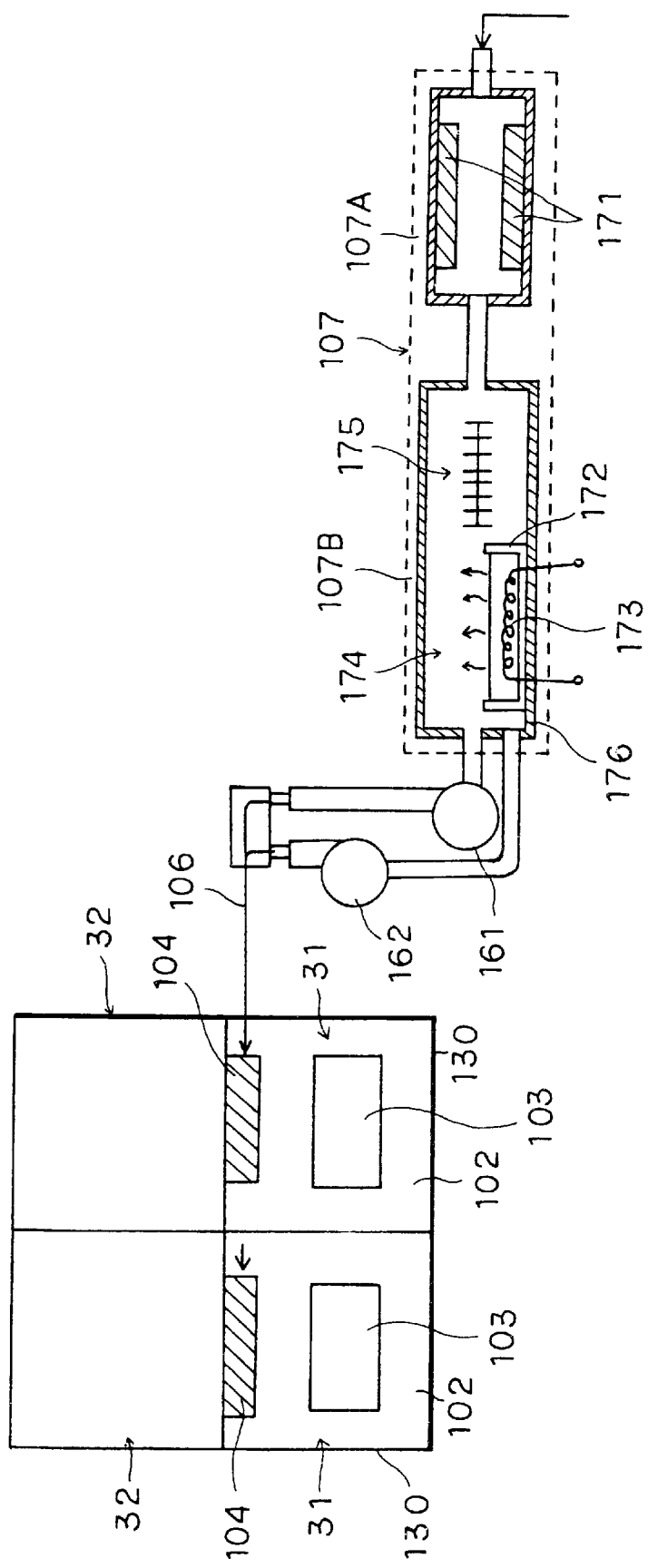
FIG. 9 is an explanatory view of the resist coating unit shown in FIG. 1.
Figure 10:
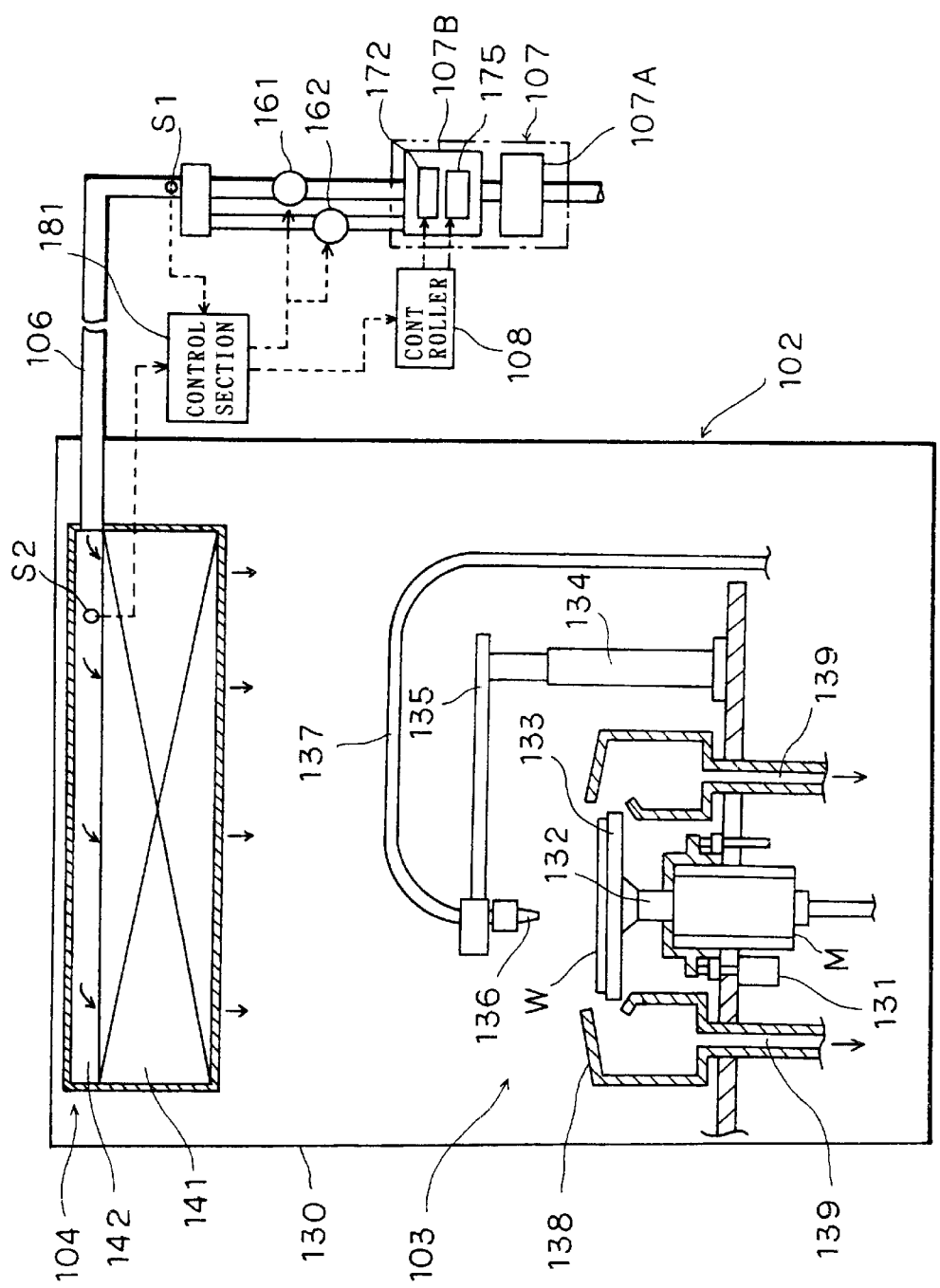
FIG. 10 is a detailed explanatory view of the resist coating unit shown in FIG. 9.

The resist coating unit 31 shown in FIG. 2 has a configuration, as shown in FIGS. 9 and 10, in which a coating treatment section 103 for coating the wafer W with resist and a filter unit 104 which is provided above the coating treatment section 103 are contained in a box 130.

As shown in FIG. 10, the coating treatment section 103 is provided with: a mounting table 133 having a vacuum adsorption function and rotatably and vertically movably supported by a motor M, a hoisting and lowering mechanism 131 and a rotation shaft 132; a nozzle 136 which can be disposed above the mounting table 133 through a supporting post 134 and a horizontal arm 135; a resist supply duct 137 for sending resist solution to the nozzle 136; a cup 138 which is provided in a manner to surround the mounting table 133; and an exhaust passage 139 which is formed inside the cup 138. The coating treatment section 103 is so structured that resist is dripped from the nozzle 136 to the wafer W on the mounting table 133 and is spread out by centrifugal force of the mounting table 133 which is rotated.

The filter unit 104 is provided with a ULPA filter 141 which is made by folding, for example, a paper material in pleat-shape for cleaning air for an atmospheric gas and a draft chamber 142 formed on the top side of the filter 141.

The draft chamber 142 of the filter unit 104 is connected with an air supply passage 106 composed of a duct which is a gas supply passage through which a temperature-controlled (temperature and humidity are controlled) air is supplied from the outside. The draft chamber 142 is also a part of the air supply duct. A temperature control section 107 is provided on the base end side of the air supply passage 106. The temperature control section 107 is disposed outside and somewhat apart from the coating and developing system 1 shown in FIG. 1 to FIG. 3 and is provided with a first unit 107A forming a cooling section and a second unit 107B for heating and humidifying. The first unit (the cooling section) 107A is structured in a manner that a Peltier element 171 and air are in contact and cools air with the Peltier element 171, for example, below the freezing point to condense moisture in the air into dew. If the cooling section 107A is composed of the Peltier element 171 (thermo-module), avoiding the use of a refrigerator, which makes the structure simple. The second unit 107B has a configuration in which a humidifying section 174 including a container 172 containing water therein and a heater 173, and a heating section 175 including a seeds-fin heater which has a plurality of discoid radiation fins arranged in parallel are provided in a box 76. The heating section 175 is provided on the upstream side of the humidifying section 174.

On the air supply passage 106 on the downstream side of the second unit 107B, two blowing fans 161 and 162 are provided in parallel. It is noted that if one powerful blowing fan is employed as a blowing means, a case of motor needs to be provided with holes for radiating because the motor generates a large amount of heat. It follows that the motor needs to be covered with a case for avoiding spreading of particles from the holes into a clean room. The use of a plurality of blowing fans of small power, for example, two fans as in this example eliminates a complex configuration of employing a case because the holes for radiation are unnecessary.

On the other hand, a first temperature detecting section S1 for detecting temperature of the temperature-controlled (temperature and humidity are controlled) air at the temperature control section 107 is provided in the vicinity of the outlet of the temperature control section 107 on the air supply passage 106. The detected temperature value which is detected at the temperature detecting section S1 is inputted in a controller 108 which is provided in the vicinity of the temperature control section 107. Further, a second temperature detecting section S2 is provided in, for example, the draft chamber 142 of the filter unit 104 in the resist coating unit 31. The detected temperature value is once inputted as an analog signal in a control section 181. The control section 181 performs controlling of a carrying system or the like and is provided with a program for the time of suspension of driving. The analog signal is converted to a digital signal at an analog/digital conversion section in the control section 181 and led to the controller 108 through, for example, a signal cable for parallel signal.

The controller 108 controls the power supply to the heating section 175 based on each detected temperature value of the first temperature detecting section S1 and the second temperature detecting section S2, and has a function for controlling the power supply to the heater 173. Regarding a method of controlling of the power supply to the heating section 175, for example as shown in FIG. 11, the detected temperature value of the second temperature detecting section S2 in the filter unit 104 is compared with a target value, the deviation thereof is compared with the detected temperature value of the first temperature detecting section S1 on the outlet side of the temperature control section 107, and the deviation thereof is defined as a power command value to the heating section 175.

Next, actions of the embodiment will be described.

Air is sent from the air supply source (not shown) on the base end side of the air supply passage 106 to the first unit 107A of the temperature control section 107 and is cooled down, for example, below 0° C., resulting in that moisture in the air is condensed in dew and eliminated. As described above, moisture in the air is once eliminated, thereby the air can be controlled into the predetermined humidity in the following second unit 107B. In the second unit 107B, the water in the container 172 is heated by the heater 173 to evaporate, thereby humidification is performed. At this time, the controller 108 controls the amount of generating heat, that is, the amount of power supply of the heater 173.

Furthermore, the air is heated by the heating section 175 and sent to the filter unit 104 by the blowing fans 161 and 162. In this example, the air which is heated in the temperature control section 107 is divided and sent to the two resist coating units 31 and 31 at the under tier of the developing treatment units 30. In each filter unit 104, the air which is sent into the draft chamber 142, with particles being removed therefrom by the filter 141, becomes clean air and flows down. The flowed down air is discharged from an exhaust passage 39.

The wafer W is delivered from the main carrier apparatus 20 to the mounting table 133 and treated with a spin-coating of resist in the situation where down flow of the clean air is formed, as has been described, in the resist coating unit 31. At this stage, treatment of predetermined lots of wafers is completed and driving of the apparatus is occasionally temporarily suspended for performing maintenance. Supplying of air for temperature control is then suspended by the program running in the control section 181 as shown in FIG. 12. When driving of the coating and developing system 1 is stopped at time t1, simultaneouly the heating section 175 and the heater 173 of the humidifying section 174 are turned off, for instance. Thereby, water temperature in the humidifying section 174 starts descending but the air having still high humidity is kept sending out into the resist coating unit 31 by the blowing fans 161 and 162 still in operation. After the passage of the predetermined time (time t2), the blowing fans 161 and 162 are stopped. Regarding timing of the stop of the blowing fans 161 and 162, time required for lowering the water temperature to a designated temperature is determine in advance, a timer is operated after the heater 173 is off, and a stop signal is outputted when the time is up. When the maintenance of the apparatus is over and the apparatus is resumed driving, the temperature control section 107 and the blowing fans 161 and 162 are operated in the same manner as described above to supply the temperature-controlled air into the filter unit 104.

According to the embodiment, when supplying of the atmospheric air into the resist coating unit 31 is suspended, the humidified air is sent into the coating unit by the blowing fans 161 and 162 while the water in the humidifying section 174 evaporates vigorously, therefore there is no possibility that moisture is condensed in dew and stay in the air supply passage 106, for example, in the duct. Consequently, when the driving of the coating and developing system 1 is resumed, the inside of the air supply passage 106 is dry, thereby the humidity of the clean air which is sent into the resist coating unit 31 becomes instantly stable and the operation can be immediately resumed. Specifically, in the case of a spin-coating of resist, uniformity of the film-thickness distribution in the coated surface is greatly affected by humidity, therefore this method is effective.

Furthermore, the temperature control section 107 is provided outside the coating and developing system 1, therefore the temperature around thereof is unstable. Thus, if control of electric power to the heating section 175 is performed with feedback of only the detected temperature value in the vicinity of the outlet of the temperature control section 107, the air which is sent into the filter unit 104 is apt to be unstable in temperature. However, not only the temperature in the vicinity of the outlet of the temperature control section 107 but also the temperature in the filter unit 104 is fed back, thereby the air becomes stable in temperature.

In the above description, the treatment apparatus is not limited to the resist coating unit for applying resist and may be employed to the prebaking unit 33 and the developing treatment unit 30 according to the embodiment described first, and to an apparatus for forming a $SiO_2$ film by coating a substrate with precursor solution of $SiO_2$ by spin-coating. Further, the substrate is not limited to a wafer and can be an LCD substrate.

Next, yet another embodiment will be described.

In the embodiment, the filter unit 104 of the resist coating unit 31 shown in FIGS. 9 and 10 is replaced with an atmosphere control section 207 which can control temperature and humidity of the atmospheric gas (clean air) which is introduced into the units. It is noted that the two developing treatment units 30 are replaced with two resist coating units 31 in the coating and developing system 1 shown in FIG. 2, thereby a coating and developing system 1' which has four resist coating units 31 is structured as shown in FIG. 13 in the description hereinafter. The present invention, however, is not limited to the above configuration.

Figure 14:
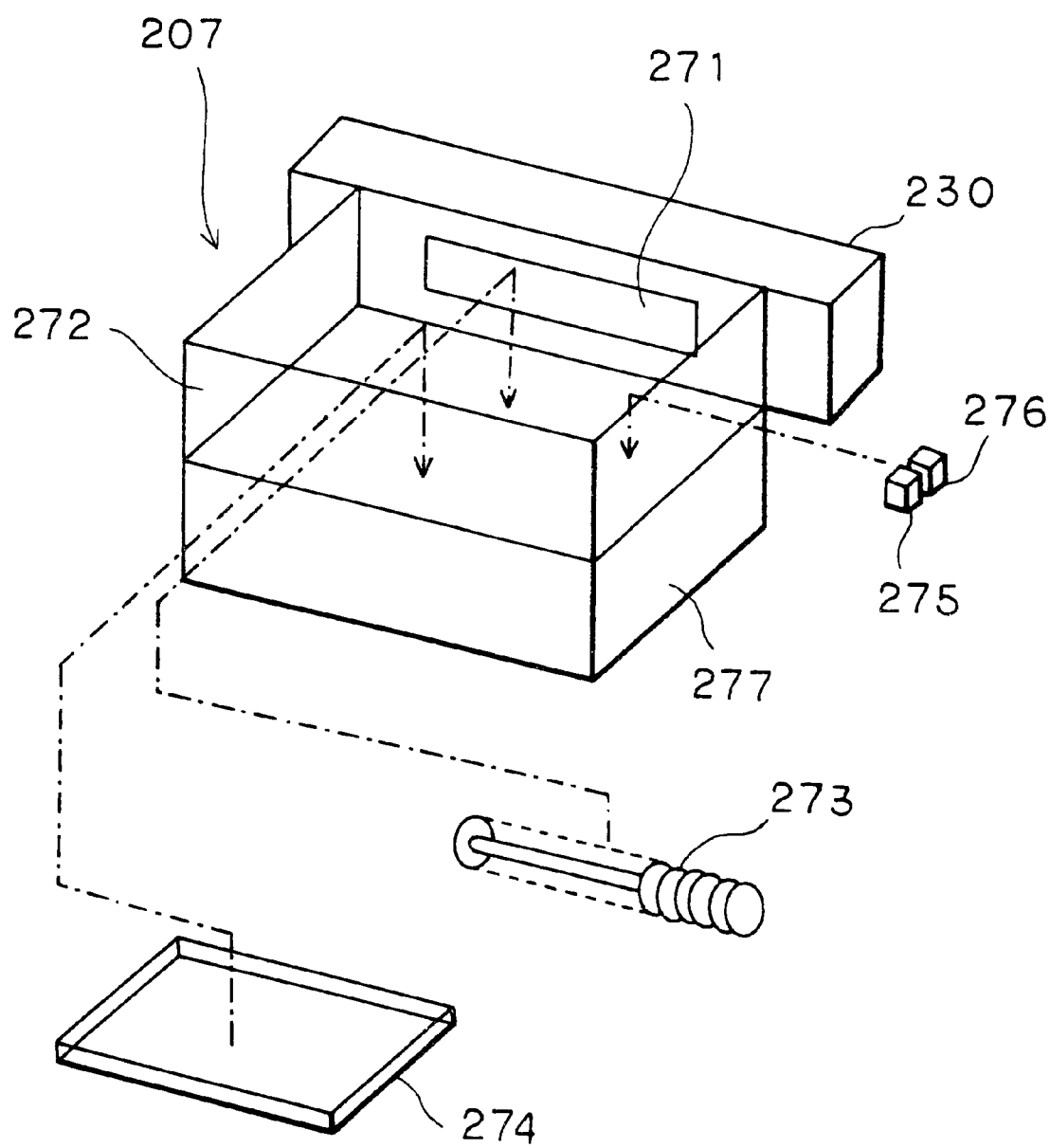
FIG. 14 is a disassembled perspective view of the resist coating unit shown in FIG. 1 according to another embodiment.

FIG. 14 is a disassembled perspective view showing an example of the atmosphere control section 207. The atmosphere control section 207 is provided with: a draft chamber 272 which is connected through an air supply passage 230 (corresponding to the air supply passage 106 in the resist coating unit 31 shown in FIGS. 9 and 10) through an air intake 271; a warmer 273 and a humidifier 274 which warms and humidifies respectively the clean air introduced into the draft chamber 272 through the air intake 271; a temperature sensor 275 and a humidity sensor 276 which respectively detect temperature and humidity of the clean air in the draft chamber 272; and a filter section 277 for removing particles and the like in the clean air which blows into the units. The warmer 273 is formed by a seeds-fin heater in which a plurality of fins are united. The humidifier 274 (not shown in particular) is composed of a water tank containing water and a heater which heats the water tank. The heater heats the water tank, thereby allowing water to evaporate so as to humidify. The filter section 277 is composed of a ULPA filter which is made by folding, for example, a paper in pleat-shape.

Figure 15:
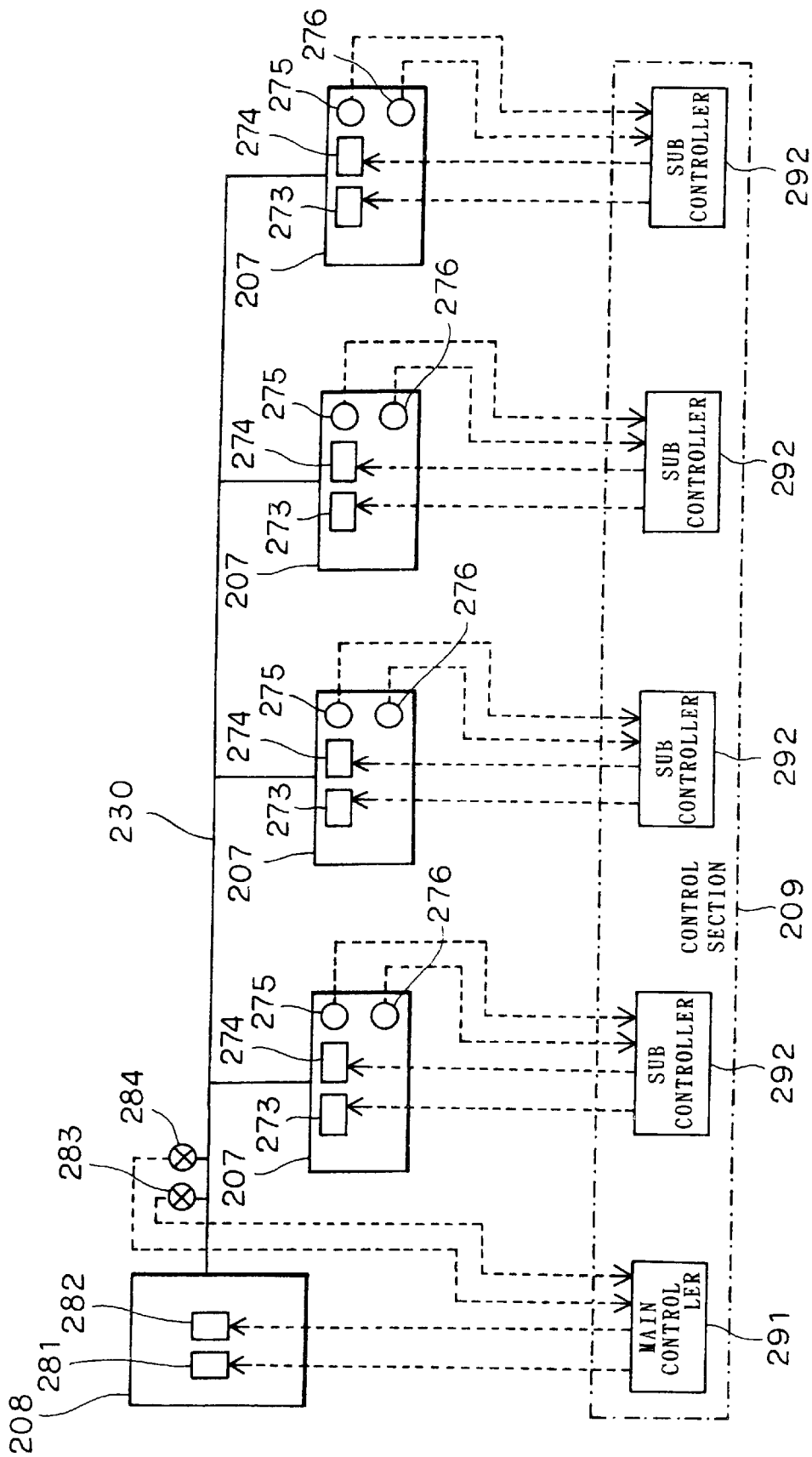
FIG. 15 is an explanatory view of the resist coating unit shown in FIG. 14.

FIG. 15 is a schematic view showing an example of an atmosphere control mechanism of a coating unit employing the atmosphere control section 207. Each atmosphere control section 207 is connected to a common gas source 208 through the air supply passage 230. The gas source 208, for example, takes in the clean air in a clean room and adjusts the air, for example, to have lower temperature than the finally required temperature in each atmosphere control section 207 by a temperature control section 281 having a heating means and a cooling means. Moreover, the gas source 208, for example, adjusts humidity of the air so as to have smaller amount of moisture than the finally required amount of moisture content in each atmosphere control section 207 by a humidity control section 282 having, for example, a dehumidifying means which is composed of a cooling section for condensing moisture in air into dew and a humidifying means, and thereafter sends out the clean air into the air supply passage 230. A temperature sensor 283 and a humidity sensor 284 are provided in the middle of the air supply passage 230 for detecting the temperature and the humidity of the sent-out clean air. Additionally, the humidity sensor 284 is served by one of the humidity sensors 276 described hereinafter which are provided in each atmosphere control section 207.

Further, the atmosphere control mechanism is controlled by a control section 209, which is provided with a main-controller 291 for controlling temperature and humidity of the clean air in the gas source 208 and a sub-controller 292 for controlling temperature and humidity of the clean air in each atmosphere control section 207. The main-controller 291 performs feed-back control of the temperature control section 281 and the humidity control section 282 based on the detected temperature value and the detected humidity value of the clean air, the values being sent from the temperature sensor 283 and the humidity sensor 284. Each sub-controller 292 performs feed-back control of the warmer 273 and the humidifier 274 which are heating sections based on the detected temperature value and the detected humidity value of the clean air, the values being sent from the respective temperature sensor 275 and humidity sensor 276.

Figure 16:
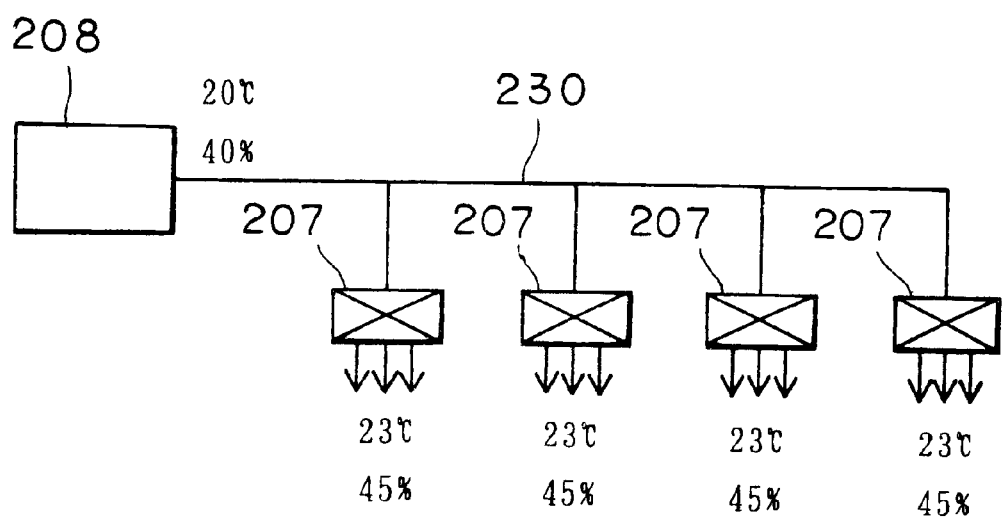
FIG. 16 is an explanatory view of the resist coating unit shown in FIG. 14.

FIG. 16 is a schematic view showing a manner of atmosphere control by the atmosphere control mechanism. For example, the clean air which is controlled at a temperature of 20° C. and a relative humidity of 40% in the gas source 208, is not uniform in temperature, for example, due to the arrangement of the resist coating units 31 at the time of being introduced into each atmosphere control section 207. In other words, temperature of the clean air supplied to a resist coating unit 31 which is placed near the heat treatment unit is likely to be higher than temperature of the clean air supplied to a resist coating unit 31 placed far from the heat treatment unit. The clean air, however, is warmed to a predetermined temperature, for example, 23° C. in each atmosphere control section 207, thereby the clean air of 23° C. is supplied into each resist coating unit 31. In this case, the absolute humidity (the amount of moisture in the air) is the same in each resist coating unit 31. Accordingly, when the same treatment is performed, for example, in four resist coating units 31, that is, when the same resist is applied, each resist coating unit 31 has the same temperature and humidity.

Alternately, four resist coating units 31, for example, are divided into two groups and when different kinds of resists are applied to each group, atmosphere having temperature and humidity suitable for each resist treatment of the groups can be selected. Regarding the control of temperature, the clean air is warmed up to a predetermined temperature by each warmer 273, and regarding the control of absolute humidity, the clean air is humidified up to a predetermined humidity by each humidifier 274.

According to the above embodiment, for example, the temperature and humidity of the clean air are controlled to be lower temperature and smaller amount of moisture than those required in each atmosphere control section 207 of four resist coating units 31 in the common gas source 208. The above air is adjusted again to the required temperature and amount of moisture in each atmosphere control section 207, therefore the control of temperature and humidity of atmosphere can be performed with high accuracy for, for example, four resist coating units 31.

Since, for example, the atmosphere of all resist coating units 31 can be thus controlled at the same state, unevenness of the film-thickness among the resist coating units 31 is restrained when the same coating treatment is performed. Further, the atmosphere can be controlled differently for each unit corresponding to the treatment matters in the respective units for four resist coating units 31. Therefore, different kinds of resists can be applied for coating at least in two resist coating units 31 out of all the resist coating units 31.

Furthermore, the gas source 208 controls the temperature and humidity of the clean air to be lower temperature and smaller amount of moisture than those of the gas which are finally required in each atmosphere control section 207. Thus, avoiding providing a means for cooling and dehumidifying of the clean air in each atmosphere control section 207, so that the atmosphere control mechanism can be compactly structured and obtained at low cost.

As has been described, the present invention can be employed to a treatment apparatus such as the prebaking unit 33 and the developing treatment unit 30 which are explained in the first embodiment, except the apparatus for applying resist solution. Further, without providing the temperature sensor 283 and the humidity sensor 284 for the gas source 208, respective detected values of the temperature sensor 275 and the humidity sensor 276 of the atmosphere control section 207, out of all atmosphere control sections 207, into which the clean gas in highest temperature is supplied, may be fed back to the main-controller 291. Furthermore, a treated object is not limited to a wafer and can be a glass substrate for a liquid crystal display.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. An apparatus to treat a substrate coated with chemically amplified resist and exposed to light, comprising:
   a treatment chamber for treating said substrate, said treatment chamber including:
   a mounting table disposed in said treatment chamber, said substrate being mounted on said mounting table;
   a heating mechanism provided in said mounting table; and
   a discharging section disposed above the center of said mounting table discharging an atmosphere in said treatment chamber; and
   a humidifying mechanism that supplies humidified gas into said treatment chamber, said humidifying mechanism including a supply port disposed around said mounting table and introducing the humidified gas into said treatment chamber.

2. The apparatus as set forth in claim 1,
   wherein said treatment chamber heat-treats said substrate which is coated with resist and exposed to light.

3. The apparatus as set forth in claim 1,
   wherein said humidifying mechanism includes:
   an airtight tank that stores liquid therein;
   a gas supply that supplies gas above the liquid which is stored in said tank; and
   a supply passage that connects a space above the liquid in said tank and said treatment chamber.

4. The apparatus as set forth claim 1,
   wherein said humidifying mechanism includes:
   an airtight tank that stores liquid therein;
   a gas supply that supplies gas into the liquid which is stored in said tank; and
   a supply passage that connects a space above the liquid in said tank and said treatment chamber.

5. The apparatus as set forth in claim 2, wherein said apparatus includes:
   a resist coating unit that coats said substrate with resist; and
   a clean air supply section that supplies a clean air into said resist coating unit, and
   wherein said humidifying mechanism humidifies the clean air which is supplied from said clean air supply section into the humidified gas and supplies the gas into said treatment chamber.

6. The apparatus as set forth in claim 1, further comprising:
   a gas supplier that supplies either a dry gas or the humidified gas into said treatment chamber; and
   a switch connected to said gas supplier that enables the gas supplier to supply one of the humidified gas or the dry gas into said treatment chamber.

7. An apparatus to treat a substrate, comprising:
   a treatment chamber for treating said substrate;
   a gas supply passage that supplies an atmospheric gas into said treatment chamber;
   a heating section provided on said gas supply passage that heats the gas;
   a humidifying section provided on said gas supply passage that humidifies the gas, said humidifying section having a heater to evaporate water stored therein;
   at least one blowing section that blows gas in said gas supply passage; and
   a controller that controls said humidifying section and said blowing section, said controller having a timer times a period of time needed for cooling the stored water,
   wherein after completing treatment of said substrate, said controller stops the heater of said humidification section and simultaneously start said timer while continuing to operate said blowing section to blow gas into said treatment chamber and
   wherein after said timer has timed the period of time, said controller stops operating said blowing section.

8. The apparatus as set forth in claim 7, further comprising:
   a filter provided in said treatment chamber that cleans gas supplied from said gas supply passage.

9. The apparatus as set forth in claim 7,
   wherein said humidifying section includes an evaporating mechanism that heats water with a heater to evaporate the water; and
   wherein said apparatus includes a temperature control section unitedly holding said heating section and said humidifying section.

10. The apparatus as set forth in claim 7, further comprising:
    a cooling section disposed on the upper stream from said heating section and said humidifying section on said gas supply passage that cools the gas.

11. The apparatus as set forth in claim 10,
    wherein said cooling section includes a Peltier element.

12. The apparatus as set forth in claim 7,
    wherein said heating section is disposed on the upper stream from said humidifying section on said gas supply passage.

13. The apparatus as set forth in claim 7,
    wherein said apparatus has a plurality of said blowing sections connected in parallel.

14. An apparatus to treat a substrate, comprising:
    a treatment chamber that treats said substrate;
    a gas supply passage having a connecting section connected to said treatment chamber that supplies an atmospheric gas through the connecting section into said treatment chamber;
    a heating section having an outlet connected to said gas supply passage that heats and supplies the gas from the outlet into said gas supply passage;
    a first temperature detecting section disposed at or in the vicinity of the outlet of said heating section;
    a second temperature detecting section disposed at or in the vicinity of the connecting section of said gas supply passage; and
    a control section that controls heating of the gas by said heating section based on the detected results obtained by said first and second temperature detecting sections.

15. The apparatus as set forth in claim 14,
    wherein said first temperature detecting section outputs the detected results as an analog signal; and
    wherein said apparatus includes an analog/digital conversion section for converting the analog signal into a digital signal and for leading the digital signal to said control section.

16. A method to treat substrate, comprising the steps of:
    (a) treating said substrate in a treatment chamber;
    (b) during said process (a), sending atmospheric gas through a gas supply passage into said treatment chamber during said process (a);

(c) during said process (b), heating the atmospheric gas;

(d) during said process (b), humidifying the atmospheric gas by heating water to evaporate the water;

(e) after completing said process (a), stopping heating the atmospheric gas and heating the water to be evaporated, and starting a timer that times a period of time needed for cooling the water to be evaporated;

(f) after completing said process (a), continuing to send the atmospheric gas through a gas supply passage into said treatment chamber;

(g) after said timer times the period of time, stopping sending the atmospheric gas through the gas supply passage into said treatment chamber.

17. A method to treat a substrate using an apparatus including:

a gas source that control temperature of atmospheric gas and supplies the atmospheric gas a plurality of treatment chambers that treat the substrates; and a plurality of atmosphere control sections each of which is provided on each treatment chamber and controls temperature of the atmospheric gas, said method comprising the steps of:

controlling the temperature of the atmospheric gas in said gas source;

sending the atmospheric gas from said gas source to said plurality of atmosphere control sections;

controlling the temperature of the atmospheric gas in each of said atmosphere control sections; and supplying the atmospheric gas from each of said atmosphere control section to each of said treatment chamber.

18. An apparatus to treat a substrate, comprising:

a plurality of treatment chambers that treat said substrates;

a gas source that supplies a temperature-controlled atmospheric gas to said treatment chamber;

a plurality of atmosphere control sections each of which is provided in each treatment chamber that control the temperature of the atmospheric gas sent from said gas source and supplies the atmospheric gas into each treatment chamber;

a cassette station where a cassette holding said substrate is carried in/out;

a heating unit that heats said substrate;

a carrier that carries said substrate among that cassette, a coating unit and said heating unit; and a plurality of filter sections provided in each treatment chamber that cleans and supplies the atmospheric gas into each treatment chamber, wherein said treatment chamber is a coating unit which coats a surface of said substrate taken out from the cassette with a coating solution; and wherein said each atmosphere control section is provided on the upstream side from said each filter section.

19. An apparatus to treat a substrate, comprising:

a plurality of treatment chambers that treat said substrates;

a gas source that supplies a temperature-controlled atmospheric gas to said treatment chamber; and a plurality of atmosphere control sections each of which is provided in each treatment chamber that control the temperature of the atmospheric gas sent from said gas source and supplies the atmospheric gas into each treatment chamber;

wherein said gas source controls the temperature of the atmospheric gas to be cooler than a temperature to which each gas needs to be adjusted in each atmosphere control section; and wherein said atmosphere control section includes a heating section for heating the atmospheric gas sent from said gas source.

20. An apparatus to treat a substrate, comprising:

a plurality of treatment chambers that treat said substrates;

a gas source that supplies a temperature-controlled atmospheric gas to said treatment chamber; and a plurality of atmosphere control sections each of which is provided in each treatment chamber that control the temperature of the atmospheric gas sent from said gas source and supplies the atmospheric gas into each treatment chamber;

wherein at least two treatment chambers of said plurality of treatment chambers perform different treatments.

21. The apparatus as set forth in claim 18, wherein said atmosphere control section has a humidifier that humidifies the atmospheric gas; and wherein said gas source has a humidity control section which controls the amount of moisture of the atmospheric gas to be smaller than that of the absolute humidity to which each gas requires to be controlled in said each atmosphere control section.

22. The apparatus as set forth in claim 18, wherein said plurality of treatment chambers all perform the same treatment.

23. A method to treat a substrate as set forth claim 17, wherein said apparatus further includes a plurality of filter sections provided on each of said treatment chambers and clean the atmospheric gas, further comprising the steps of:

filtering the atmospheric gas controlled in temperature in said atmosphere control section before supplying the atmospheric gas to each of said treatment chamber; and coating a surface of the substrate with a coating solution in said treatment chamber.

* * * * *